(12) United States Patent
Ikenaga et al.

(10) Patent No.: US 6,703,696 B2
(45) Date of Patent: Mar. 9, 2004

(54) SEMICONDUCTOR PACKAGE

(75) Inventors: Chikao Ikenaga, Tokyo (JP); Kouji Tomita, Tokyo (JP); Tsuyoshi Tsunoda, Tokyo (JP)

(73) Assignee: Dainippon Printing Co., Ltd., Tokyo (JP)

( * ) Notice: Subject to any disclaimer, the term of this patent is extended or adjusted under 35 U.S.C. 154(b) by 0 days.

(21) Appl. No.: 09/945,210

(22) Filed: Aug. 31, 2001

(65) Prior Publication Data

US 2002/0027297 A1 Mar. 7, 2002

(30) Foreign Application Priority Data

Sep. 4, 2000 (JP) .......................... 2000-266704

(51) Int. Cl.[7] .............................................. H01L 21/44
(52) U.S. Cl. ...................... 257/678; 257/666; 257/672; 257/673
(58) Field of Search ................. 257/666, 778, 257/676, 700, 678, 787, 672, 673

(56) References Cited

U.S. PATENT DOCUMENTS

| | | | | |
|---|---|---|---|---|
| 5,032,895 A | * | 7/1991 | Horiuchi et al. | ............... 357/72 |
| 5,153,706 A | * | 10/1992 | Baba et al. | ................... 357/70 |
| 5,157,478 A | * | 10/1992 | Ueda et al. | ................... 357/72 |
| 5,653,891 A | * | 8/1997 | Otsuki et al. | .................. 216/11 |
| 5,969,426 A | * | 10/1999 | Baba et al. | .................. 257/778 |
| 6,034,422 A | * | 3/2000 | Horita et al. | ............... 257/677 |
| 6,087,712 A | * | 7/2000 | Kim et al. | ................... 257/666 |
| 6,388,311 B1 | * | 5/2002 | Nakashima et al. | ......... 257/676 |
| 6,404,216 B1 | * | 6/2002 | Tandy | ......................... 324/755 |
| 2002/0084518 A1 | | 7/2002 | Hasebe et al. | |
| 2002/0117740 A1 | | 8/2002 | Jang et al. | |

* cited by examiner

*Primary Examiner*—Matthew Smith
*Assistant Examiner*—Renzo Rocchegiani
(74) *Attorney, Agent, or Firm*—Flynn, Thiel, Boutell & Tanis, P.C.

(57) ABSTRACT

A semiconductor package is comprised of a semiconductor device 4 mounted on a die-pad 3, a wire 6 for electrically connecting some electrodes of the semiconductor device 4 and terminals 5 of lead frame, wires 8 for bonding the other electrodes of semiconductor device to the surface of die-pad for grounding, and molding compound 7 for encapsulating the outer area of semiconductor device 4 under a state where the back face of die-pad 3. The lower face and side face of terminals 5 are exposed, wherein portions plated with silver for connecting of wires on the surface of the die-pad are formed at points positioned between a peripheral edge of the die-pad and an outer edge of the semiconductor device while leaving spaces from both the edges. The adhesion of die-pad 3 to bonding compound 7 is improved to avoid the occurrence of wires coming-off even if heat is applied to the contact points of die-pad 3 to wires 8 when mounting semiconductor package on a printed circuit board.

17 Claims, 8 Drawing Sheets

(A)

(B)

(A)

(B)

SEMICONDUCTOR PACKAGE

BACKGROUND OF THE INVENTION

1. Field of the Invention

The present invention relates to a semiconductor package in which a semiconductor device is mounted on a lead frame and the outside thereof, particularly the upper surface of the semiconductor device is encapsulated with molding compound.

2. Description of the Prior Art

In recent years, it has been necessary to miniaturize and shape semiconductor products mounted on a substrate so as to be thinner, since the packaging of the semiconductor is more dense. It has been required for LSI to reduce the number of chips by improving integration level and to miniaturize and make a package lighter. The popularization of so-called CSP (Chip Size Package) is rapidly increasing. Particularly, in the development of a thin semiconductor product with a lead frame, the semiconductor package of the single side encapsulation type has been developed in which a semiconductor device is mounted on a lead frame and the surface of semiconductor device mounted on a lead frame is encapsulated with molding compound.

FIG. 1 is a sectional view of one example of a semiconductor package. FIG. 2 is a plan view thereof as seen through a molding compound. The semiconductor package shown in FIGS. 1 and 2 is comprised of a lead frame 1, a semiconductor device 4 mounted on a die-pad 3 supported with suspending leads 2 of lead frame 1, metallic thin wires 6 for electrically connecting electrodes provided on the top face of the semiconductor device 4 with respective terminals 5 of lead frame 1, and molding compound 7 for encapsulating the outside region of semiconductor device 4 including the upper side of semiconductor device 4 and the lower side of die-pad 3. The semiconductor package is of the so-called non-lead type in which outer leads do not project from the semiconductor package and the two inner leads and outer leads are integrated into terminals 5, wherein in the lead frame 1, suspending leads 2 are directed upward in such a manner that die-pad 3 is positioned higher than terminals 5. Since such a step is provided between die pads 3 and terminals 5, molding compound 7 can be inserted into the lower side of die-pad 3.

Since the semiconductor device is miniature, a matrix type frame is mainly used for the above-mentioned non-lead type of semiconductor package, in which plural semiconductor devices are arranged in a direction of a width of the matrix type frame. Further, recently, due to a demand for reduced cost, it is thought to switch over from a frame of the individually molded type shown in FIGS. 3(A) and 3(B) to a frame of the collectively molded type shown in FIGS. 4(A) and 4(B).

In the frame of the individually molded type, as shown in FIG. 3(A), individual molding cavities C of a small size are provided separately within a frame F. After molding, individual semiconductor packages are stamped out so that semiconductor packages S shown in FIG. 3(B) are obtained. Namely, semiconductor devices are mounted on die-pads of lead frames through silver paste and others, and wire bonding is carried out. Thereafter, the respective semiconductor devices are individually molded with molding compound and the molded semiconductor devices are stamped out to form individual semiconductor packages.

In the frame of the collectively molded type, as shown in FIG. 4(A), some molding cavities C of large size are provided within a frame F. Multiple semiconductor devices are arranged in a matrix within each molding cavity C, respectively and are collectively molded with molding compound. Thereafter, the collectively molded semiconductor devices are cut at grid-leads L by means of a dicing saw so that a semiconductor package S shown in FIG. 4(B) is obtained. Namely, semiconductor devices are mounted on die-pads of lead frames through silver pastes and others and wire bonding is carried out. Thereafter, plural semiconductor devices are collectively molded with molding compound to a given cavity size, and then the collectively molded semiconductor devices are cut to form individual semiconductor packages by dicing.

In the above-mentioned non-lead semiconductor package, there is a type of semiconductor package in which a die-pad is exposed to increase the effect of heat radiation, and bonding of some electrodes of the semiconductor device to the surface of the die-pad 3 is needed for grounding. FIG. 5 is a sectional view of such a type of semiconductor package. FIG. 6 is a plan view of the semiconductor package seen through the molding compound thereof. When producing the collectively molded semiconductor packages, each semiconductor device 4 is mounted on the die-pad 3 of lead frame 1 through silver paste and others. Thereafter, given electrodes on the top face of each semiconductor device 4 are connected with terminals through wires 6, and the other electrodes on each semiconductor device 4 are connected with the surface of die-pad 3 through wire 8. Thereafter, semiconductor devices are collectively molded with molding compound 7, and then as above-mentioned, the collectively molded semiconductor devices are cut to form individual semiconductor packages. In this case, in a type of semiconductor package shown in FIG. 1, silver plating (not shown) is made on the wire connecting points of terminals 5 in lead frame 1, while in a type of semiconductor package shown in FIG. 5, silver plating is made also on the surface of die-pad 3.

When mounting the semiconductor package shown in FIG. 5 on a printed circuit board, solder plating is made not only on the exposed portions of terminals 5, but also on the exposed portions of die-pad 3. Further, solder cream is applied on the areas on a printed circuit board corresponding to the exposed portions of terminals 5 and die-pad 3. The semiconductor package mounted on a printed circuit board is heated in an oven at about 230° C., by which solder is made to re-flow so that the semiconductor package is fixed firmly at a given position on a printed circuit board.

However, in the semiconductor package shown in FIG. 5, stress is applied to the contact point of die-pad 3 to wires 8 when making solder re-flow from a difference in thermal expansion coefficient between the molding compound 7 and the copper material of lead frame 1, and the adhesion of portions of plated silver for connecting of wires applied on the surface of die-pad to molding compound 7 is not enough so that the trouble of coming-off of wires occurs. Further, there is a case where a crack is generated in the molding compound from the neighborhood of the corners of the die-pad as the starting point, wherein there is the possibility of cutting of wires occurs according to a state of crack.

SUMMARY OF THE INVENTION

It is an object of the present invention to provide a semiconductor package in which bonding of some electrodes of the semiconductor device to the surface of a die-pad for grounding is made, wherein no trouble of coming-off of wires or cutting of wires occurs.

In order to achieve the above-mentioned object, a semiconductor package of the present invention comprises a semiconductor device mounted on a die-pad supported by suspending leads of a lead frame, wires for electrically connecting given electrodes arranged on a top face of the semiconductor device with terminals of the lead frame, wires for bonding the other electrodes arranged on the top face of the semiconductor device to the surface of the die-pad for grounding and a molding compound for encapsulating an outer area of the semiconductor device including all the wires, while the lower face of the die-pad and the lower face and side face of the terminals are exposed, wherein portion(s) plated with silver for connecting of the wires on the surface of the die-pad are formed at points positioned between a peripheral edge of the die-pad and an outer edge of the semiconductor device while leaving spaces from both the edges.

DESCRIPTION OF THE PREFERRED EMBODIMENT

Then, referring to the figures, the embodiments of the present invention are explained.

Figure 8:
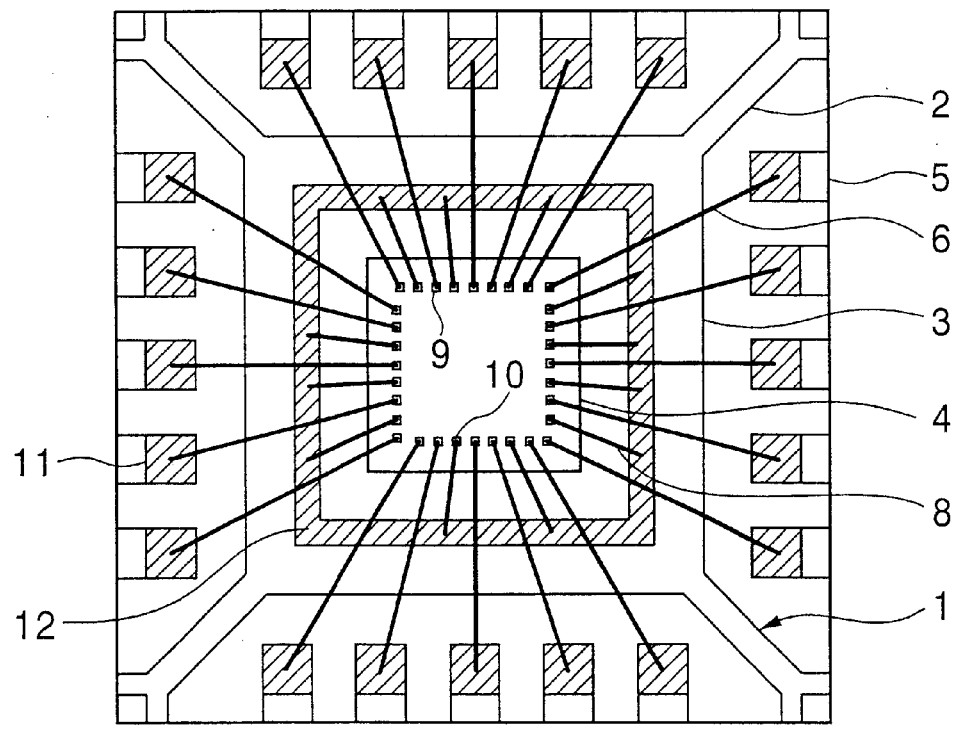
FIG. 8 is a plan view of the semiconductor package shown in FIG. 7 showing a state thereof seen through the molding compound.

FIG. 8 is a sectional view of one example of a semiconductor package according to the present invention. FIG. 8 is a plan view showing a state of the semiconductor package seen through a molding compound.

Figure 1:
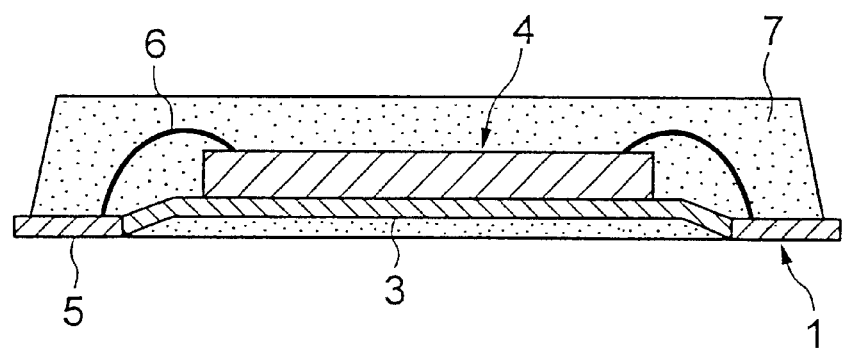
FIG. 1 is a sectional view of one example of a semiconductor package.
Figure 2:
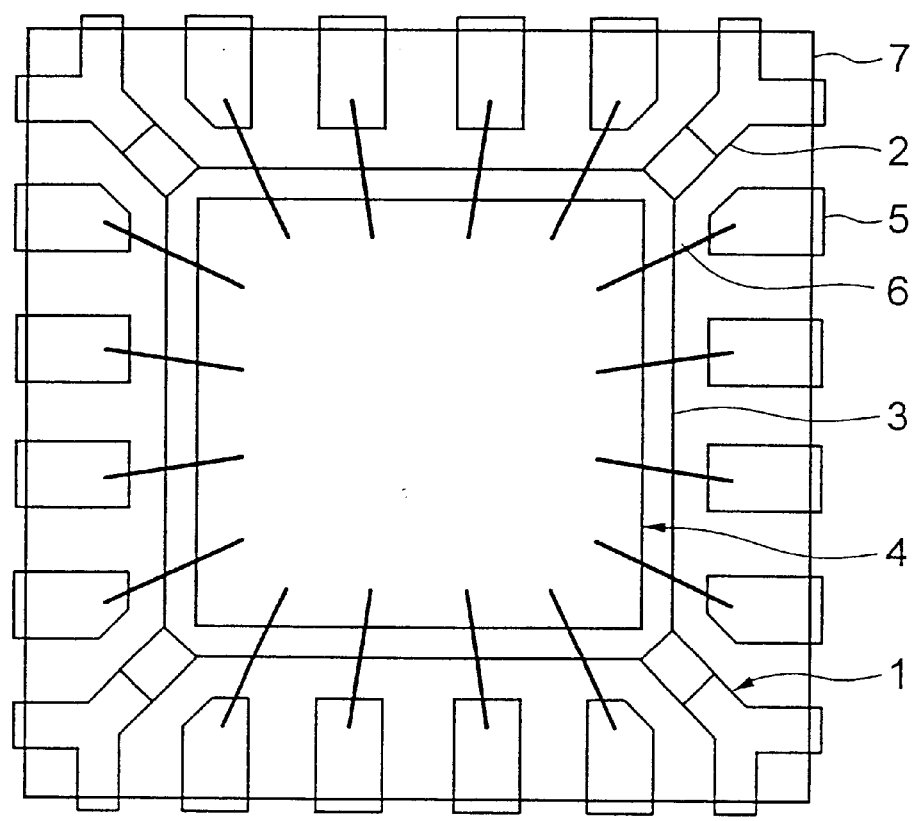
FIG. 2 is a plan view of the semiconductor package shown in FIG. 1, showing a state thereof as seen through the resin encapsulating the semiconductor package.
Figure 3:
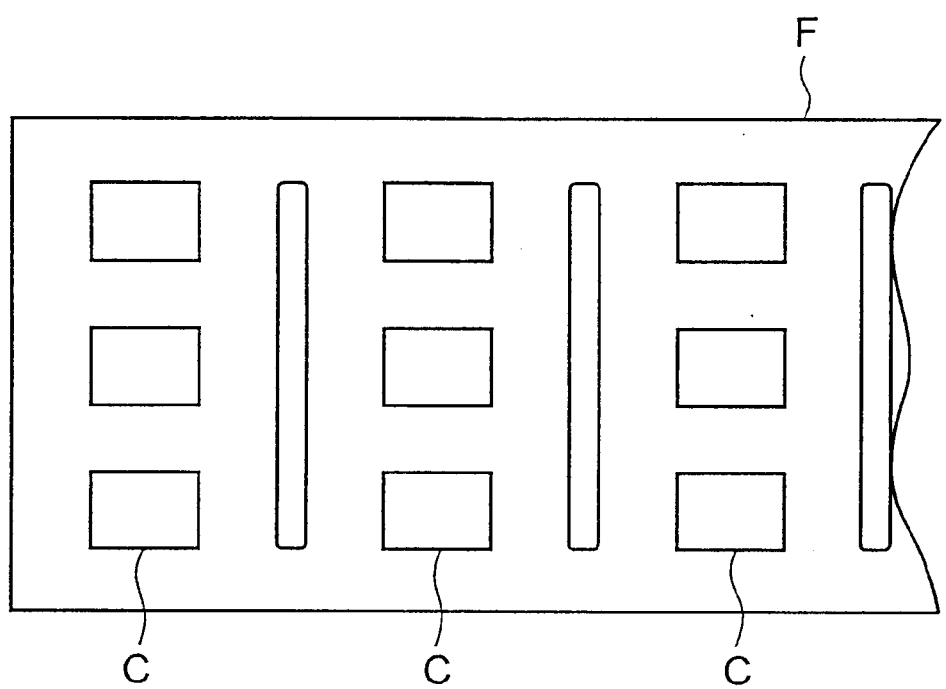
FIGS. 3(A) and 3(B) are explanatory views of an individually molded type of semiconductor package.
Figure 3:
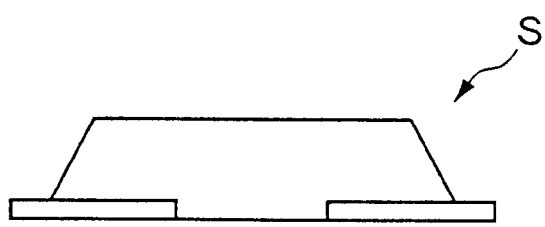
Figure 4:
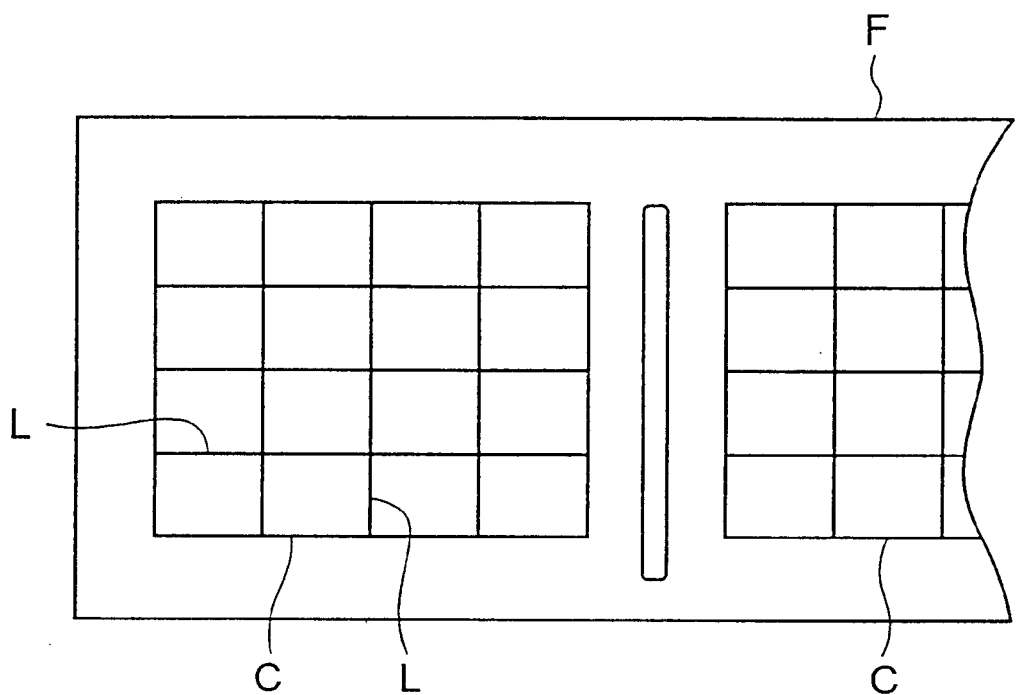
FIGS. 4(A) and 4(B) are explanatory views of a collectively molded type of semiconductor package.
Figure 4:
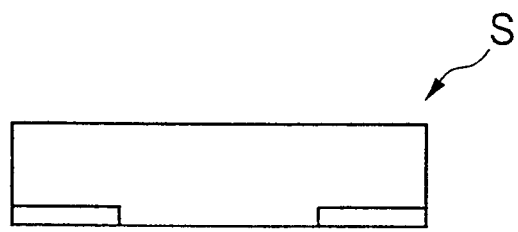
Figure 5:
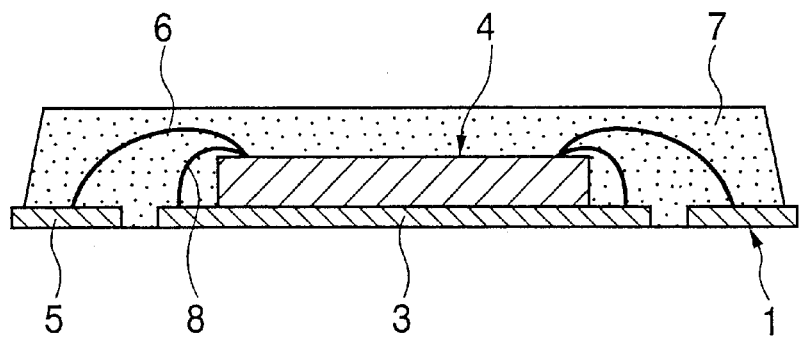
FIG. 5 is a sectional view of semiconductor package wherein some electrodes are bonded to a die-pad through wires for grounding.
Figure 6:
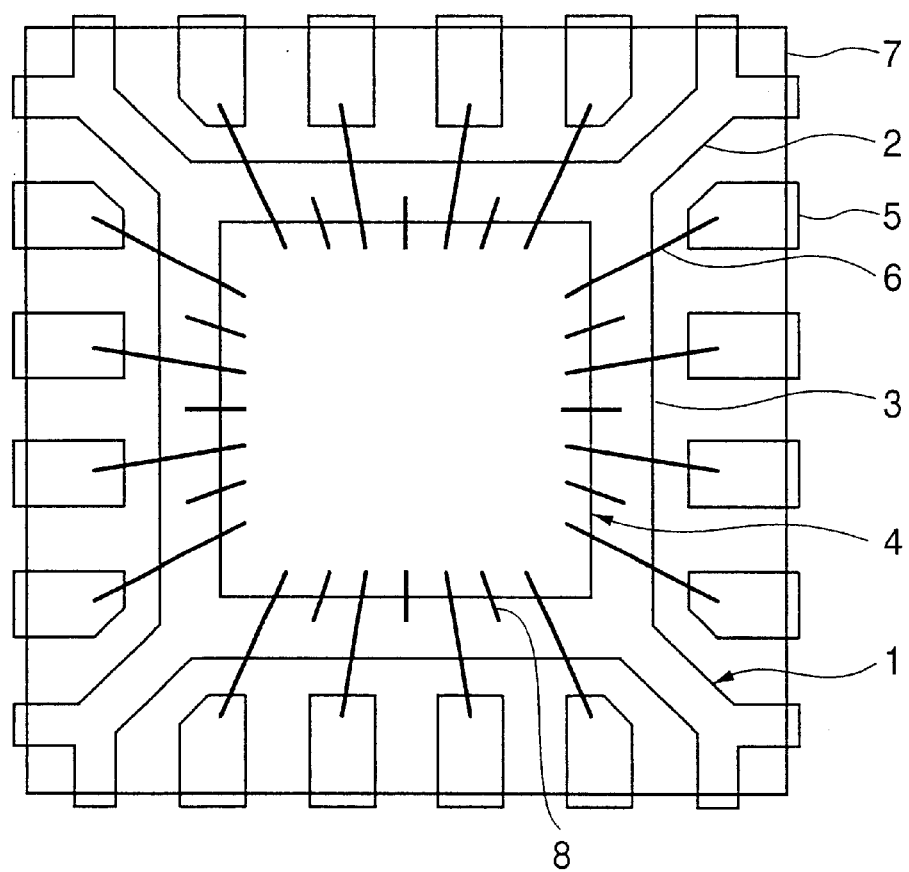
FIG. 6 is a plan view of the semiconductor package shown in FIG. 5, showing a state thereof seen through the molding compound.
Figure 7:
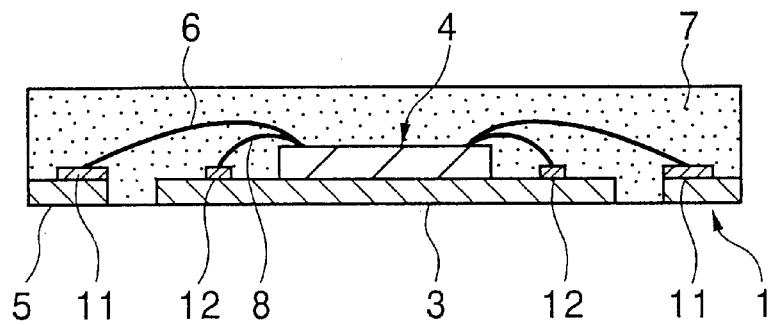
FIG. 7 is a sectional view of one example of a semiconductor package according to the present invention.

The semiconductor package is a collectively molded type of semiconductor package as shown in FIGS. 7 and 8.

Referring to FIGS. 7 and 8, the semiconductor package comprises a semiconductor device 4 mounted on a die-pad 3 supported by suspending leads 2 of a lead frame 1, wires 6 for electrically connecting given electrodes 9 arranged on a top face of the semiconductor device 4 with terminals 5 of the lead frame, wires 8 for bonding the other electrodes 10 arranged on the top face of semiconductor device 4 to the surface of the die-pad for grounding and molding compound 7 for encapsulating an outer area of semiconductor device 4 including all the wires 6, 8, while the lower face of die-pad 3 and the lower face and side face of terminals 5 are exposed. Further, portions 11 are plated with silver to define wire-connection parts of terminals 5, and portion 12 plated with silver for connecting of wires is formed on the surface of die-pad 3. Portions 11, 12 plated with silver are shown with hatching in FIG. 8 in order to make it easy to read the figure.

Portion 12 plated with silver on the surface of die-pad 3 is, as shown in FIG. 8, formed into a shape of a line or a linear shape between a peripheral edge of die-pad 3 and an outer edge of semiconductor device 4 while leaving spaces from both the edges. Accordingly, molding compound 7 is made into contact not only with portion 12 plated with silver but also with the copper material of the lead frame on both sides of the linear shaped area plated with silver. Therefore, adhesion of portion plated with silver to molding compound 7 is improved as compared with a case where all molding compound 7 is made into contact with portion plated with silver.

Further, in the exampled shown in FIGS. 7 and 8, portion 12 plated with silver is formed continuously. However, portion 12 plated with silver may be divided into a plurality of portions plated with silver formed into a form of islands defined only on the parts of the die-pad 3 to be connected with wire 8. The discontinuous forming of portions 12 plated with silver in such a manner makes the area of resin 7 contacting the copper surface of the lead frame larger so that the adhesion of resin 7 to portions 12 plated with silver is improved.

In this case, portions 11, 12 plated with silver are formed on a frame in which a plurality of lead frames 1 are arranged in a matrix, in the same manner as conventional case, wherein however, portions 12 plated with silver on die-pad 3 are formed into a linear shape or discontinuously, differently from conventional case.

Figure 9:
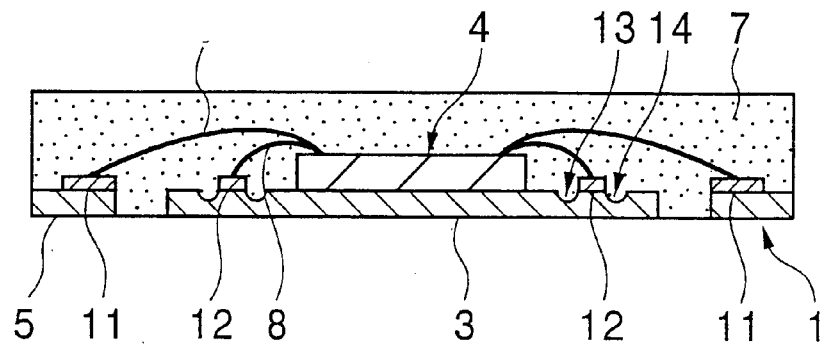
FIG. 9 is a sectional view of another example of a semiconductor package according to the present invention.
Figure 10:
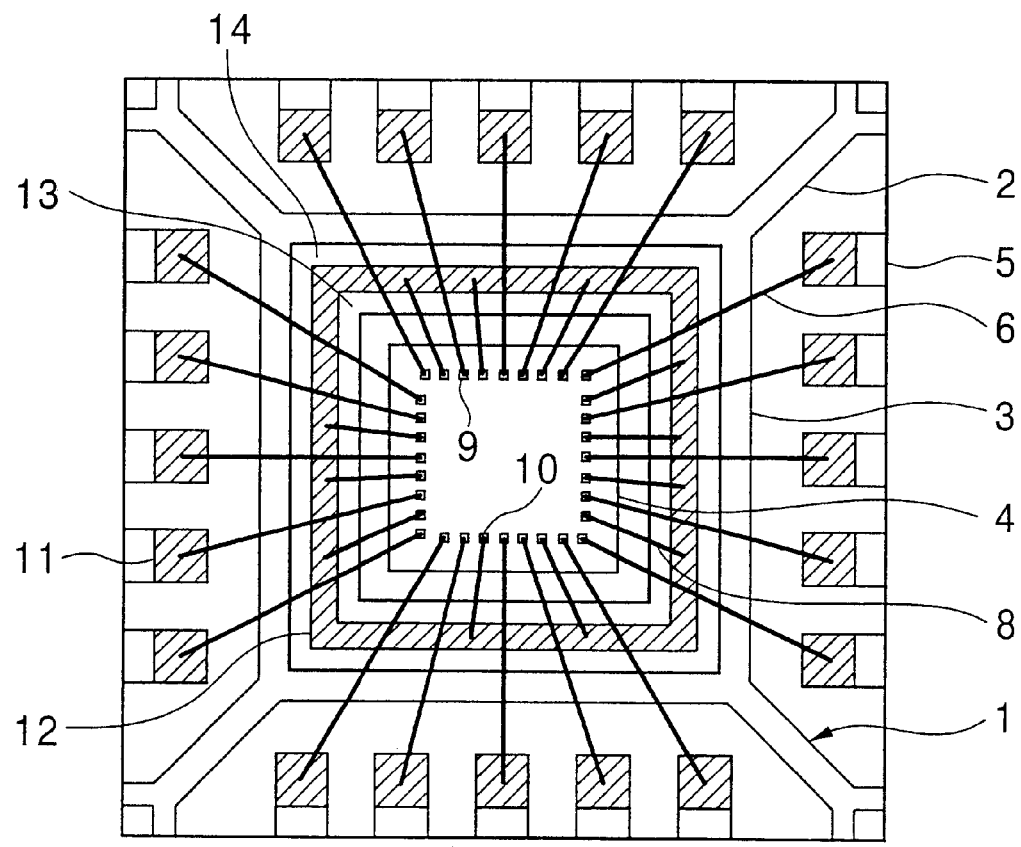
FIG. 10 is a sectional view of the semiconductor package shown in FIG. 9, showing a state thereof seen through the molding compound.

FIG. 9 is a sectional view of another example of a semiconductor package according to the present invention. FIG. 10 is a plan view of the semiconductor package, showing a state thereof seen through molding compound.

The semiconductor package is nearly the same as the example shown in FIGS. 7 and 8, wherein however, this semiconductor package has concave portions 13, 14 formed along both sides of portion 12 plated with silver for connecting of wires on the surface of die-pad 3. Since molding compound 7 is inserted into the concave portions 13, 14 in this semiconductor package, the adhesion of molding compound 7 to die-pad 3 is further improved.

In this case, there is an effect that the adhesion of molding compound 7 to die-pad 3 can be increased even by only a concave portion formed on one side of linear portion 12 plated with silver. Further, in order to increase the adhesion of molding compound 7 to die-pad 3, the concave portion can be formed into through hole 13A or 14A as diagrammatically illustrated in FIG. 9. However, in this case, it is needed to leave a part of concave portion in such a manner that die-pad 3 does not fall down.

Figure 11:
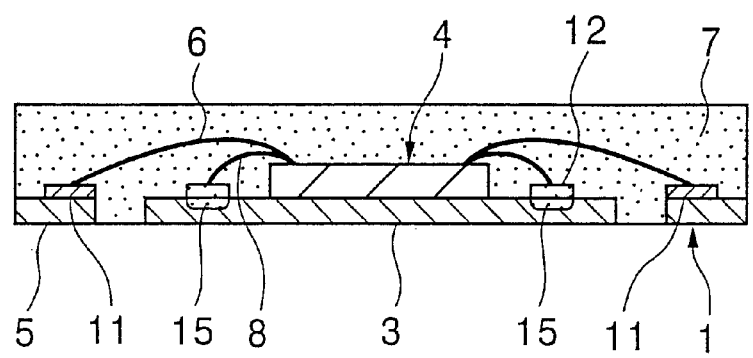
FIG. 11 is a sectional view of a further example of a semiconductor package according to the present invention.
Figure 12:
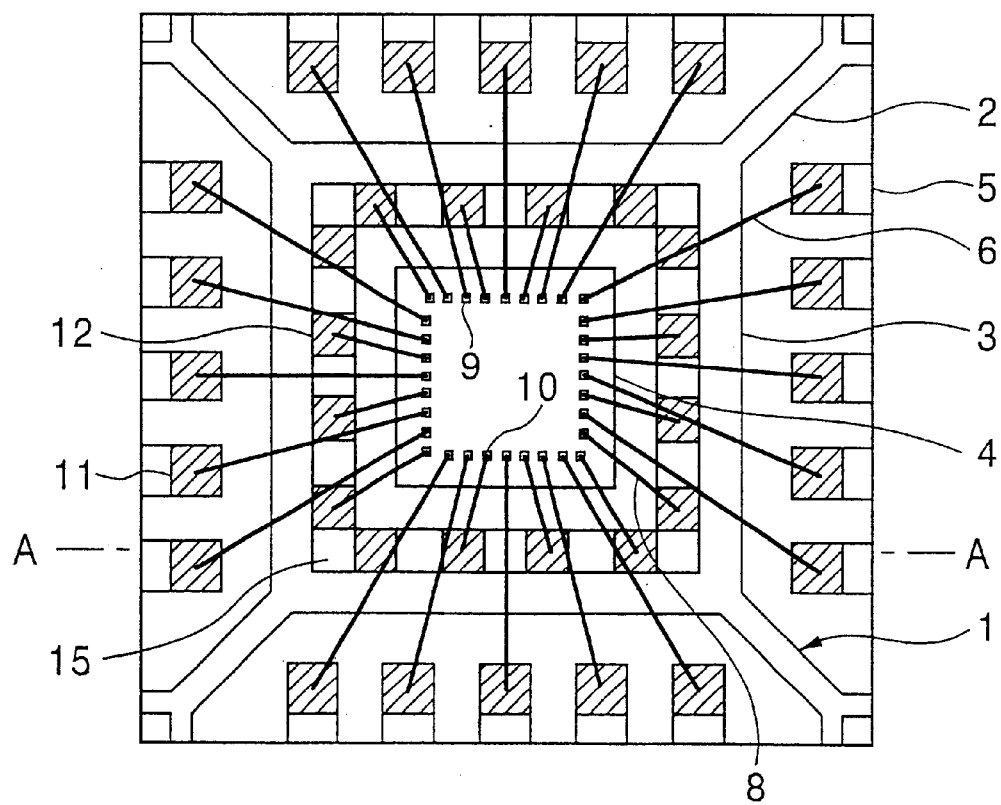
FIG. 12 is a plan view of the semiconductor package shown in FIG. 11, showing a state thereof seen through the molding compound.
Figure 13:
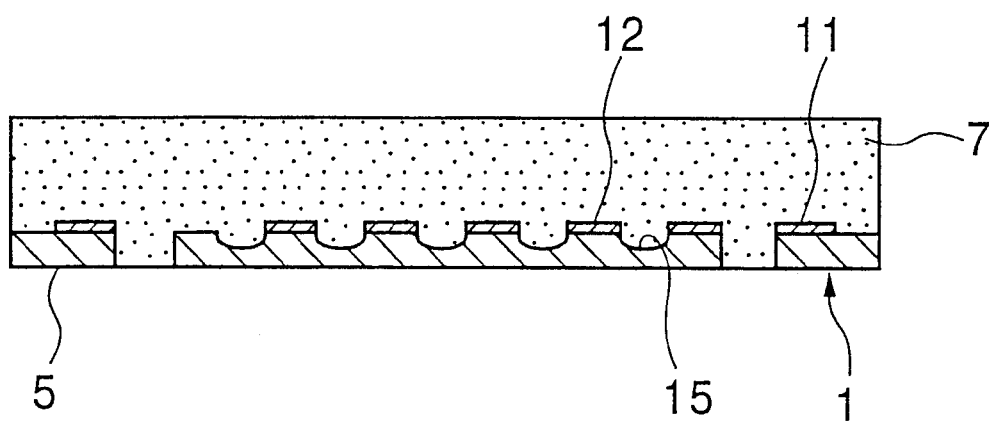
FIG. 13 is a sectional view taken of line A—A of FIG. 12.

FIG. 11 is a sectional view of a further example of a semiconductor package according to the present invention. FIG. 12 is a plan view showing a state of the semiconductor package seen through molding compound. FIG. 13 is a sectional view taken on line A—A of FIG. 12.

The semiconductor package shown in FIG. 11 differs from the first example shown in FIGS. 7 and 8 in the structure of the portion 12 plated with silver for connection of wires on the surface of die-pad 3. That is, portions plated with silver for connection of wires are formed discontinuously. And concave portions 15 are formed between discontinuous portions 12 plated with silver. In the semiconductor package, since molding compound 7 penetrates into these concave portions 15, the adhesion of molding compound 7 to die-pad 3 is further increased.

In this case, through hole 15A can be applied instead of concave portions 15 as diagrammatically illustrated in FIG. 11 in phantom outline, by which the adhesion of molding compound 7 to die-pad 3 can be increased.

In this case, the above-mentioned concave portions can be formed by half-cutting by etching or impressing of material of lead frame, when forming a lead frame. Further, through holes can be formed by etching material of lead frame from both sides of the material or stamping the material.

In the above-mentioned explanation, a collectively molded type of semiconductor package is mentioned. An individually molded type of semiconductor package has the same construction as the collectively molded type of semiconductor package.

As explained hereinbefore, the semiconductor package of the present invention comprises a semiconductor device mounted on a die-pad supported by suspending leads of a lead frame, wires for electrically connecting given electrodes arranged on a top face of the semiconductor device with terminals of the semiconductor device, wires for bonding the other electrodes arranged on the top face of the semiconductor device to the surface of the die-pad for grounding and molding compound with which an outer area of the semiconductor device including all the wires is encapsulated, wherein portions plated with silver for connecting of wires on the surface of the die-pad are formed at points positioned between a peripheral edge of the die-pad and an outer edge of the semiconductor device while leaving spaces from both the edges. Accordingly, the molding compound is also in contact with the copper material of the lead frame so that the adhesion of die-pad to molding compound is increased. Therefore, the reliability can be secured that no trouble of coming-off of wires or cutting of wires occur in mounting a semiconductor package on a printed circuit board.

What is claimed is:

1. A semiconductor package comprising a semiconductor device mounted on a die-pad supported by suspending leads of a lead frame, wires electrically connecting terminal electrodes arranged on a top face of the semiconductor device with terminals of the lead frame, wires bonding other grounding electrodes arranged on the top face of the semiconductor device to the surface of the die-pad for grounding, and molding compound which encapsulates an outer area of the semiconductor device including all the wires, wherein at least one plated portion of the die-pad is plated with silver for connecting of the wires on the surface of the die-pad and is formed on the die-pad so as to be positioned between a peripheral edge of the die-pad and an outer edge of the semiconductor device with spaces being defined between both of the edges and each said plated portion positioned therebetween, the plated portion plated with silver being formed into a shape of a line to define a linear shaped area which extends continuously about said semiconductor device, said plated portion being spaced outwardly of said semiconductor edge such that one said unplated portion is defined therebetween.

2. A semiconductor package as claimed in claim 1, wherein a concave portion is formed along at least one side of the linear shaped area.

3. A semiconductor package as claimed in claim 1, wherein a further said unplated portion is defined between said plated portion and said peripheral die-pad edge.

4. A semiconductor package comprising a semiconductor device mounted on a die-pad supported by suspending leads of a lead frame, wires electrically connecting terminal electrodes arranged on a top face of the semiconductor device with terminals of the lead frame, wires bonding other grounding electrodes arranged on the top face of the semiconductor device to the surface of the die-pad for grounding, and molding compound which encapsulates an outer area of the semiconductor device including all the wires, wherein one or more plated portions of the die-pad are plated with silver for connecting of the wires on the surface of the die-pad and are formed at points on the die-pad positioned between a peripheral edge of the die-pad and an outer edge of the semiconductor device with spaces being defined between both of the edges and each said plated portion positioned therebetween, a concave portion being provided along at least one side of the one or more plated portions and one or more through holes being formed in the concave portion leaving at least a part of the concave portion.

5. A semiconductor package comprising a semiconductor device mounted on a die-pad supported by suspending leads of a lead frame, wires electrically connecting terminal electrodes arranged on a top face of the semiconductor device with terminals of the lead frame, wires bonding other grounding electrodes arranged on the top face of the semiconductor device to the surface of the die-pad for grounding, and molding compound which encapsulates an outer area of the semiconductor device including all the wires, wherein one or more plated portions of the die-pad are plated with silver for connecting of the wires on the surface of the die-pad and are formed at points on the die-pad positioned between a peripheral edge of the die-pad and an outer edge of the semiconductor device with spaces being defined between both of the edges and each said plated portion positioned therebetween, the plated portions plated with silver being formed discontinuously to define discontinuous portions wherein through holes are formed between the discontinuous portions.

6. A semiconductor device as claimed in claim 5, wherein concave portions are formed between the discontinuous portions plated with silver.

7. A semiconductor package comprising:
   a lead frame having suspending leads and terminals;
   a semiconductor device having an outer semiconductor edge and a top face which includes a plurality of terminal electrodes and grounding electrodes;
   a die-pad supported on said suspending leads of said lead frame and having a mounting surface on which said semiconductor device is mounted, said mounting surface having an outer area extending outwardly from said semiconductor device to a peripheral die-pad edge which is spaced outwardly of said semiconductor edge, said outer area of said mounting surface including at least one plated portion which is plated with silver over said mounting surface and has a linear shape which extends continuously in surrounding relation with said semiconductor device, said plated portion being spaced outwardly of said semiconductor edge and inwardly of said die-pad edge such that unplated portions of said outer section are disposed between said plated portion and said semiconductor edge and said die-pad edge, said plated portion being spaced outwardly of said semiconductor edge such that one said unplated portion is defined therebetween;

wires comprising terminal wires electrically connecting said terminal electrodes with said terminals on said lead frame and grounding wires electrically connecting said grounding electrodes with said one or more plated portions on said die-pad; and molding compound which encapsulates said semiconductor device, said wires and at least said mounting surface of said die-pad so as to be in contact with said plated portions and said unplated portions of said die-pad.

8. A semiconductor package as claimed in claim 7, wherein a further said unplated portion is defined between said plated portion and said peripheral die-pad edge.

9. A semiconductor package as claimed in claim 7, wherein a plurality of said plated portions are spaced outwardly of said semiconductor device.

10. A semiconductor package as claimed in claim 9, wherein said plated portions are spaced apart one from the other.

11. A semiconductor package comprising:

a semiconductor device having a peripheral semiconductor edge;

a lead frame having suspending leads and terminals, said lead frame further including a die-pad supported on said lead frame and formed of a die-pad material, said die-pad having a mounting surface on which said semiconductor device is mounted, said mounting surface having an outer area that extends outwardly of said semiconductor device to a peripheral die-pad edge which is spaced outwardly of said outer semiconductor edge, said outer area of said mounting surface including at least one plated portion which is plated with a plating material over said mounting surface and has a linear shape which extends continuously in surrounding relation with said semiconductor device, said plated portion being disposed outwardly of said semiconductor edge and inwardly of said die-pad edge such that unplated portions of said outer section are defined by said die-paid material, said unplated portions being disposed adjacent said plated portions between said semiconductor edge and said die-pad edge, said plated portion being spaced outwardly of said semiconductor edge such that one said unplated portion is defined therebetween;

wires which are electrically connected to said semiconductor device and extend outwardly therefrom, wherein first said wires are electrically connected to said terminals and second said wires are electrically connected to said one or more plated portions; and molding compound which encapsulates said semiconductor device, said wires and at least said mounting surface of said die-pad so as to be in contact with said plated portions and said unplated portions of said die-pad.

12. A semiconductor package as claimed in claim 11, wherein said second wires connected to said die-pad are grounding wires.

13. A semiconductor package as claimed in claim 11, wherein said plating material is silver.

14. A semiconductor package as claimed in claim 11, wherein said die-pad material is copper.

15. A semiconductor package as claimed in claim 11, wherein said die-pad is electrically separated from said terminals.

16. A semiconductor package as claimed in claim 11, wherein concave portions are formed adjacent to said plated portion.

17. A semiconductor package as claimed in claim 11, wherein said molding compound has greater adhesion with said die-pad material in comparison to said plating material.

* * * * *